United States Patent
Park et al.

(10) Patent No.: US 6,706,607 B2
(45) Date of Patent: Mar. 16, 2004

(54) METHOD FOR FABRICATING CAPACITOR IN SEMICONDUCTOR DEVICE

(75) Inventors: Jong-Bum Park, Ichon-shi (KR); Hoon-Jung Oh, Ichon-shi (KR); Kyong-Min Kim, Ichon-shi (KR)

(73) Assignee: Hynix Semiconductor Inc., Ichon-shi (KR)

( * ) Notice: Subject to any disclaimer, the term of this patent is extended or adjusted under 35 U.S.C. 154(b) by 0 days.

(21) Appl. No.: 10/316,874

(22) Filed: Dec. 12, 2002

(65) Prior Publication Data

US 2003/0235947 A1 Dec. 25, 2003

(30) Foreign Application Priority Data

Jun. 21, 2002 (KR) .................................... 2002-35096

(51) Int. Cl.⁷ .......................................... H01L 21/8242
(52) U.S. Cl. ...................... 438/393; 438/240; 438/250
(58) Field of Search .............................. 438/240, 238, 438/250, 393, FOR 230, FOR 430

(56) References Cited

U.S. PATENT DOCUMENTS

| 4,423,087 A | * | 12/1983 | Howard et al. ............... 427/79 |
| 4,437,139 A | * | 3/1984 | Howard ...................... 361/313 |
| 4,471,405 A | * | 9/1984 | Howard et al. ............. 361/305 |
| 5,643,817 A | * | 7/1997 | Kim et al. .................. 205/124 |
| 6,346,741 B1 | * | 2/2002 | Van Buskirk et al. ...... 257/664 |
| 6,436,817 B2 | | 8/2002 | Lee |
| 6,486,022 B2 | * | 11/2002 | Lee ............................. 438/240 |
| 6,486,530 B1 | * | 11/2002 | Sasagawa et al. .......... 257/532 |
| 6,509,601 B1 | * | 1/2003 | Lee et al. .................... 257/310 |
| 6,541,332 B2 | * | 4/2003 | Song ........................... 438/240 |
| 2002/0160565 A1 | * | 10/2002 | Lee ............................. 438/240 |

* cited by examiner

*Primary Examiner*—George Fourson
*Assistant Examiner*—Joannie Adelle Garcia
(74) *Attorney, Agent, or Firm*—Jacobson Holman PLLC

(57) ABSTRACT

The present invention relates to a method for fabricating a capacitor in a semiconductor device; and, more particularly, to a method for fabricating a capacitor capable of stably forming a nitride layer on a lower electrode and obtaining improvements on stable capacitance and leakage current characteristics. The inventive method for fabricating a capacitor includes the steps of: forming a lower electrode on a substrate; forming a nitride-based first dielectric thin layer on the lower electrode; forming a second dielectric thin layer by depositing an $Al_2O_3$ layer on the nitride-based first dielectric thin layer; forming a third dielectric thin layer on the second dielectric thin layer; and forming an upper electrode on the third dielectric thin layer.

5 Claims, 2 Drawing Sheets

METHOD FOR FABRICATING CAPACITOR IN SEMICONDUCTOR DEVICE

FIELD OF THE INVENTION

The present invention relates to a method for fabricating an integrated circuit in a semiconductor device; and, more particularly, to a method for fabricating a capacitor in a semiconductor device.

DESCRIPTION OF RELATED ARTS

As a degree of integration of a memory device, particularly, a dynamic random access memory (DRAM), increases progressively, a memory cell area that is a basic unit for storing information significantly decreases.

The decrease in the memory cell area brings another reduction of an area for cell capacitance, thereby decreasing a sensing margin and a sensing speed. Moreover, there results in another problem of decreased durability for soft error that occurs due to α-particles. Therefore, it is necessary to develop a method for obtaining sufficient capacitance within a limited cell area.

The capacitance of a capacitor is defined by the following mathematic equation.

$$C = \in \cdot As/d \qquad \text{Eq. 1}$$

Herein, $\in$, As and d denote a dielectric constant, an effective surface area of an electrode and a distance between the electrodes, respectively.

Hence, there has been developed several approaches to increase the capacitance of-the capacitor by increasing the surface area of the electrode, decreasing a thickness of a dielectric thin layer and increasing the dielectric constant.

Among these approaches, it is firstly considered an approach of increasing the surface area of the electrode. Capacitors in various forms of a three-dimensional structure such as a concave, a cylinder, a multi-layered fin and so on are aimed to increase the effective surface area of the electrode within the limited area. However, as a degree of integration of a semiconductor device becomes extensively high, this approach confronts another limitation in that the effective surface area of the electrode cannot be increased sufficiently.

Also, another approach of decreasing the thickness of the dielectric material to minimize the distance (d) between the electrodes is limited as well since leakage currents increase as the thickness of the dielectric thin layer gets decreased.

Therefore, it is a recent trend in increasing mainly the dielectric constant of the dielectric thin layer, and thus, obtaining the sufficient capacitance of the capacitor. A traditionally fabricated capacitor uses a silicon oxide layer or a silicon nitride layer as a source for the dielectric thin layer. However, it is more increasingly used in today a capacitor with a metal-insulator-poly si (hereinafter referred as to MIS) structure wherein it uses a high-k dielectric material, e.g., $Ta_2O_5$ as a dielectric thin layer.

Figure 1:
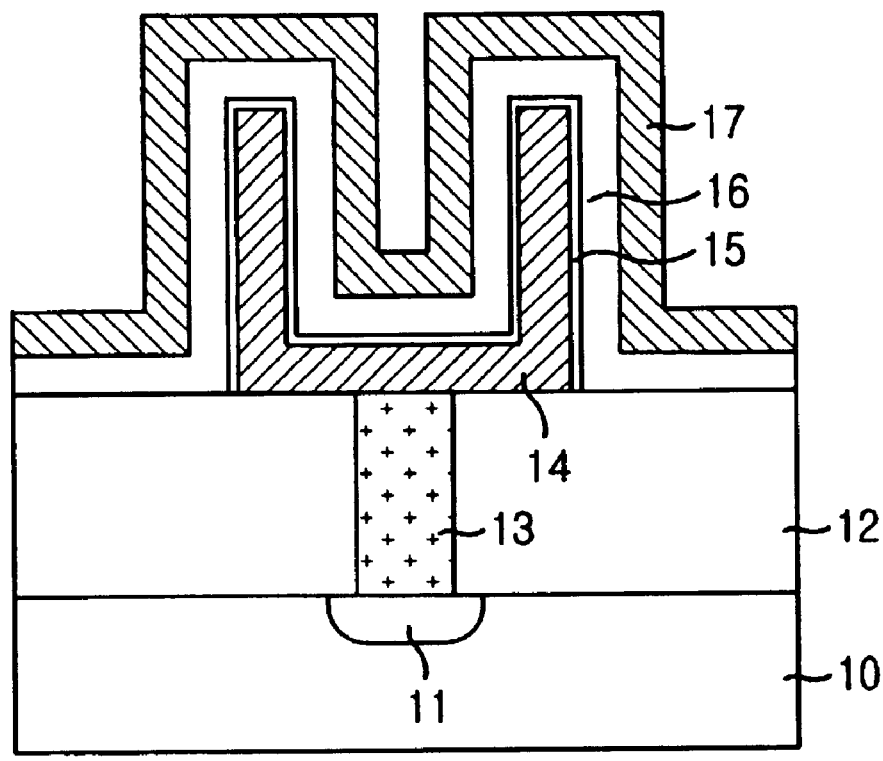

FIGS. 1 is a cross-sectional view illustrating a typical method for fabricating a capacitor having a cylinder structure in a semiconductor device.

Referring to FIG. 1, an inter-layer insulation layer 12 is formed on a substrate 10 previously constructed with an activation area 11, and then, a contact hole that passes through the inter-layer insulation layer 12 and is contacted to the activation area 11 of the substrate 10 is formed. Subsequently, the contact hole is filled with a conductive material, forming a contact plug 13. On top of the contact plug 13, a capacitor insulation layer is formed as with the size for forming a capacitor.

Next, the capacitor insulation layer is selectively etched to expose the contact plug 13 and form a capacitor hole.

A polysilicon lower electrode 14 is formed inside the capacitor hole, and the capacitor insulation layer is then removed. After forming the polysilicon lower electrode 14, a nitride layer 15 is formed by nitridating a surface of the polysilicon lower electrode 14 through the use of $Si_3N_4$ plasma gas or a rapid thermal process.

A $Ta_2O_5$ layer is formed on the nitride layer 15 as a dielectric thin layer 16, and an upper electrode 17 is overlaid subsequently.

Herein, the surface of polysilicon lower electrode 14 is nitridated with use of the $Si_3N_4$ plasma gas before forming the $Ta_2O_5$ layer for forming the dielectric thin layer 16. This prior nitridation is to prevent oxygen from penetrating into the polysilicon lower electrode 14 and oxidizing it while carrying out a thermal process in an atmosphere of oxygen in order to improve a dielectric constant.

As a high degree of integration is progressively embodied in a semiconductor device, and particularly, as a capacitor has a three-dimensional structure in a concave form or a cylinder form, it is difficult to nitride the surface of the polysilicon lower electrode 14 with a constant thickness. That is, a typical plasma process or a rapid thermal process does not allow the nitride layer to be formed stably on the polysilicon lower electrode 14.

If the nitride layer is not formed properly, oxygen gets penetrated into the bottom structure of the capacitor, e.g., polysilicon lower electrode, and oxidizes the bottom structure. This problem eventually reduces a confidence level in the capacitor fabrication.

SUMMARY OF THE INVENTION

It is, therefore, an object of the present invention to provide a method for fabricating a capacitor, wherein a nitride layer is stably formed on a lower electrode and sufficient capacitance and improved leakage current characteristics are obtained.

In accordance with an aspect of the present invention, there is provided A method for fabricating a capacitor in a semiconductor device, including the steps of: forming a lower electrode on a substrate; forming a nitride-based first dielectric thin layer on the lower electrode; forming a second dielectric thin layer by depositing an $Al_2O_3$ layer on the nitride-based first dielectric thin layer; forming a third dielectric thin layer on the second dielectric thin layer; and forming an upper electrode on the third dielectric thin layer.

BRIEF DESCRIPTION OF THE DRAWING(S)

Figure 2:
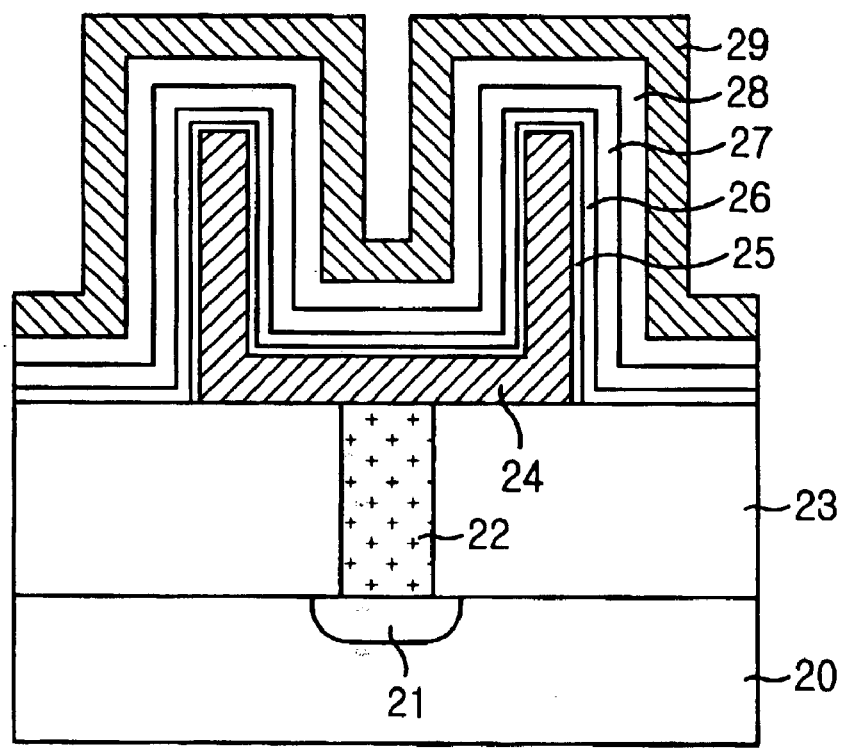

The above and other objects and features of the present invention will become apparent from the following description of the preferred embodiments given in conjunction with the accompanying drawings, in which:

FIG. 1 is a cross-sectional view showing a typical method for fabricating a capacitor in a semiconductor device in accordance with the prior art; and FIG. 2 is a cross-sectional view showing a method for fabricating a capacitor in a semiconductor device in accordance with a preferred embodiment of the present invention.

DETAILED DESCRIPTION OF THE INVENTION

FIG. 2 is a cross-sectional view showing a method for fabricating a capacitor in a semiconductor device in accordance with a preferred embodiment of the present invention.

With reference to FIG. 2, an inter-layer insulation layer 23 is formed on a substrate 20 previously constructed with an activation area 21, and then, a contact hole that passes through the inter-layer insulation layer 23 and is contacted to the activation area 21 of the substrate 20 is formed. The contact hole is subsequently filled with a conductive material to form a contact plug 22. A capacitor insulation layer is formed on top of the contact plug 22 as high as to form a capacitor. Herein, the capacitor insulation layer can use oxide layers such as undoped-silicate glass, phospho-silicate glass, boro-phospho silicate glass and so forth.

Next, the capacitor insulation layer is selectively etched to expose the contact plug 22 and form a capacitor hole.

Inside of the capacitor hole, a polysilicon layer for forming a lower electrode 24 is deposited till having a thickness in a range from about 100 Å to about 500 Å, and a native oxide layer formed on the polysilicon layer is removed by cleaning a surface of the polysilicon layer with use of HF or a buffer oxide etchant (hereinafter referred as to BOE). At this time, it is possible to use $NH_4OH$, $H_2O_2$ and $H_2O_2$ (SC-1) with a ratio of $NH_4OH:H_2O_2:H_2O_2$ is 1:4:20.

It is also alternatively possible to form the lower electrode 24 by doping $PH_3$ in an atmosphere of $N_2$ at a temperature ranging from about 500° C. to about 700° C. after depositing a doped polysilicon layer in a thickness ranging from about 50 Å to about 300 Å and a undoped polysilicon layer in a thickness ranging from about 50 Å to about 300 Å. Subsequently, the capacitor insulation layer is removed.

An enhanced furnace nitride (hereinafter referred as to EFN) process is performed to form a first nitride layer 25 in a form of $Si_3N_4$ on the polysilicon lower electrode 24. Immediately after the EFN process, a thermal process is performed in an atmosphere of $NH_3$ gas under an in-situ environment wherein a temperature and a pressure are maintained within a range from about 500° C. to about 800° C. and a range from about 1 Torr to 30 Torr, respectively. Then, the $NH_3$ gas is used again to deposit a second nitride layer 26 at the above mentioned temperature. The first and the second nitride layers 25 and 26 become a first dielectric thin layer with a deposited thickness in a range from about 5 Å to about 50 Å. Herein, the EFN process is a process that nitrides a surface of a lower electrode in a form of $Si_3N_4$ through a thermal process at a furnace and subsequently applies $NH_3$ gas at the identical temperature as applied for the former thermal process under an in-situ environment to form double nitride layers eventually.

In a previous technology in 0.1 μm gate line-width, a rapid thermal process (hereinafter referred to as RTP) or a plasma process is generally employed to form a nitride layer for preventing oxygen from penetrating into a lower electrode and other bottom structures of the semiconductor device. At this time, a thickness of an oxide layer (hereinafter referred as to $T_{ox}$) for obtaining a predetermined capacitance should be greater than about 40.8 Å. On the other hand, in case of applying the EFN process for forming the nitride layer, it is possible to obtain a specifically desired size of capacitance as long as the $T_{ox}$ is greater than about 34 Å.

Also, if a $N_2O$ plasma process is carried out again after the EFN process, it is also possible to obtain a specifically desired size of capacitance although the $T_{ox}$ is greater than about 30 Å. However, a leakage current characteristic is often more negatively pronounced than before after applying the $N_2O$ plasma process. That is, the nitride layer is formed on the lower electrode, and then, the $Ta_2O_5$ layer is deposited thereon as a dielectric thin layer. The $N_2O$ plasma process is subsequently proceeded after the deposition, and this application of the $N_2O$ plasma process provides a specifically desired size of capacitance even if a thickness of the dielectric thin layer is reduced compared to the application of other processes, e.g., approximately 30 Å in the technology of 0.1 μm gate line-width.

Despite of this provided advantage, the application of $N_2O$ plasma process aggravates the leakage current characteristic of the capacitance. Therefore, the present invention employs a method for depositing triple dielectric thin layers by depositing an $Al_2O_3$ layer instead of applying the $N_2O$ plasma process.

Next, the $Al_2O_3$ layer of which leakage current characteristic is good is deposited as a second dielectric thin layer 27 on the first dielectric thin layer including the first and the second nitride layers 25 and 26 till having a thickness ranging from about 20 Å to about 100 Å by using an atomic layer deposition (hereinafter referred as to ALD) process.

In more details with respect to the $Al_2O_3$ layer deposition for forming the second dielectric thin layer 27, a temperature of a wafer is set to be in a range from about 200° C. to about 500° C. and a pressure of a reaction chamber is maintained within a range from about 0.1 Torr to about 1 Torr. Also, $(CH_3)_3Al$ gas and $NH_3$ gas are used as a source gas and a transportation gas, respectively. The $(CH_3)_3Al$ gas is supplied with the $NH_3$ gas for about 0.1 second to about several seconds, e.g., 10 seconds, so as to be absorbed on the substrate 20. Then, $N_2$ gas is flowed thereon for several seconds, e.g., from about 0.1 second to about 10 seconds, so that unreacted $(CH_3)_3Al$ gas are purged.

Next, $H_2O$ gas that is a main source for supplying oxygen is flowed to the substrate 20 for about 0.1 second to several seconds, e.g., 10 seconds, and the $N_2$ gas is successively flowed for several seconds, e.g., from about 0.1 second to about 10 seconds so as to purge the unreacted $H_2O$ gas.

The ALD process as described above is repeatedly applied until obtaining a desired thickness and forms the second dielectric thin layer 27.

In continuous to the ALD process for forming the second dielectric thin layer 27, a third dielectric thin layer 28 is formed by depositing a Ta2O5 layer on the second dielectric thin layer 27 with a thickness ranging from about 30 Å to about 100 Å. At this time, a temperature and a pressure are maintained within a range from about 200° C. to about 500° C. and from about 0.1 Torr to about 1.0 Torr, respectively. $Ta(C_2H_5O)_5$ and $O_2$ are especially used to form the $Ta_2O_5$ dielectric layer. Herein, $O_2$ is used as a reactant gas. Also, the third dielectric thin layer 28 can use high-k dielectric materials such as $(Ba,Sr)TiO_3$ or ferroelectric materials such as $(pb,Zr)TiO_3$, $(Pb,La)(Zr,Ti)O_3$, $SrBi_2Ta_2O_9$, $Bi_{4-x}La_xTi_3O_{12}$ and so forth.

After forming the third dielectric thin layer 28, a thermal process is performed at a furnace maintained with a temperature arranged from about 500° C. to about 800° C. in an atmosphere of $N_2O$ or $O_2$.

A subsequent chemical vapor deposition (CVD) process is applied to deposit consecutively a TiN layer and a polysilicon layer on the third dielectric thin layer 28 for forming an upper electrode 29. Then, an activation annealing process is proceeded at a furnace maintained with a temperature ranging from about 500° C. to about 700° C. in an atmosphere of $N_2$ gas.

Accordingly, depositing the triple dielectric thin layers of the nitride layer, the $Al_2O_3$ layer and the $Ta_2O_5$ layer on the polysilicon lower electrode improves a dielectric constant of the capacitance and the leakage current characteristic by omitting the $N_2O$ plasma process, which aggravates the leakage current characteristic.

Furthermore, the use of $Al_2O_3$ layer as a dielectric thin layer increases clearly the dielectric constant, and thus, pronouncedly decreases the $T_{ox}$ of the capacitor. As seen from the above, in accordance with the preferred embodiment of the present invention, it is ultimately possible to fabricate a highly integrated capacitor with the high dielectric constant and the enhanced leakage current characteristic.

While the present invention has been described with respect to certain preferred embodiments, it will be apparent to those skilled in the art that various changes and modifications may be made without departing from the scope of the invention as defined in the following claims.

What is claimed is:

1. A method for fabricating a capacitor in a semiconductor device comprising the steps of:

forming a lower electrode on a substrate;

forming a nitride-based first dielectric layer on the lower electrode;

forming a second dielectric layer by depositing an $Al_2O_3$ layer on the nitride-based first dielectric layer through an atomic layer deposition (ALD) process, wherein the ALD process includes the steps of:

flowing $(CH_3)_3Al$ gas as a source gas and $NH_3$ gas for about 0.1 seconds to 10 seconds on the substrate;

flowing $N_2$ gas for about 0.1 seconds to 10 seconds to purge the unreacted $(CH_3)_3$ Al gas;

flowing $H_2O$ gas that is a source for supplying oxygen to the substrate for 0.1 seconds to 10 seconds; and flowing the $N_2$ gas for about 0.1 seconds to 10 seconds to purge the unreacted $H_2O$ gas.

forming a third dielectric layer on the second dielectric layer; and forming an upper electrode on the third dielectric layer.

2. The method as recited in claim 1, wherein the ALD process is performed by maintaining a temperature of a wafer in a range from about 200° C. to about 500° C. and a pressure of a reaction chamber in a range from about 0.1 Torr to about 1 Torr.

3. The method as recited in claim 1, wherein the $Al_2O_3$ layer is deposited with a thickness ranging from about 20 Å to about 100 Å.

4. The method as recited in claim 1, wherein the step of forming the nitride-based first dielectric layer includes the steps of:

nitridating a surface of the lower electrode at a furnace through a thermal process. and depositing a nitride layer on the nitridated lower electrode by using $NH_3$ gas.

5. The method as recited in claim 4, wherein the steps of nitridating the surface of the lower electrode and depositing the nitride layer are performed at a temperature and a pressure maintained within a range from about 500° C. to about 800° C. and from about 1 Torr to about 30 Torr, respectively.

* * * * *